(12) United States Patent
Parker

(10) Patent No.: US 7,224,169 B2
(45) Date of Patent: *May 29, 2007

(54) METHODS AND APPARATUS FOR NON-CONTACT TESTING AND DIAGNOSING OF INACCESSIBLE SHORTED CONNECTIONS

(75) Inventor: Kenneth P. Parker, Ft. Collins, CO (US)

(73) Assignee: Agilent Technologies, Inc., Santa Clara, CA (US)

( * ) Notice: Subject to any disclaimer, the term of this patent is extended or adjusted under 35 U.S.C. 154(b) by 227 days.

This patent is subject to a terminal disclaimer.

(21) Appl. No.: 10/979,590

(22) Filed: Nov. 2, 2004

(65) Prior Publication Data

US 2006/0103391 A1    May 18, 2006

(51) Int. Cl.
*G01R 31/08* (2006.01)
*G01R 27/26* (2006.01)
(52) U.S. Cl. ..................... 324/519; 324/686
(58) Field of Classification Search ................. 324/519
See application file for complete search history.

(56) References Cited

U.S. PATENT DOCUMENTS 5,124,660 A    6/1992 Cilingiroglu
5,254,953 A    10/1993 Crook et al.
5,274,336 A    12/1993 Crook et al.
5,381,417 A    1/1995 Loopik et al.
5,498,964 A    3/1996 Kerschner et al.
5,557,209 A    9/1996 Crook et al.
5,696,451 A    12/1997 Keirn et al.
6,087,842 A    7/2000 Parker et al.
6,097,203 A    8/2000 Parker et al.
2005/0068051 A1*    3/2005 Tesdahl et al. .............. 324/750
2005/0253616 A1*    11/2005 Parker et al. ................ 324/765

* cited by examiner

*Primary Examiner*—Vincent Q. Nguyen

(57) ABSTRACT

A method and apparatus for detecting shorts between accessible and inaccessible signal nodes (e.g., integrated circuit pins) of an electrical device (e.g., an integrated circuit), using capacitive lead frame technology is presented. In accordance with the method of the invention, an accessible node under test is stimulated with a known source signal. A capacitive sense plate is capacitively coupled to at least one of the accessible node and inaccessible node of the electrical device, and a measuring device coupled to the capacitive sense plate capacitively senses a signal present on the at least one of the accessible node and inaccessible node of the electrical device. Based on the value of the capacitively sensed signal, a known expected "defect-free" capacitively sensed signal measurement and/or a known expected "shorted" capacitively sensed signal measurement, one can determine whether a short fault exists between the accessible node and inaccessible node of the electrical device.

11 Claims, 5 Drawing Sheets

METHODS AND APPARATUS FOR NON-CONTACT TESTING AND DIAGNOSING OF INACCESSIBLE SHORTED CONNECTIONS

BACKGROUND OF THE INVENTION

The present invention relates generally to integrated circuit testing, and more particularly to a method and apparatus for non-contact testing and diagnosing of inaccessible shorted integrated circuit connections.

During the manufacture of circuit assemblies such as printed circuit boards (PCBs), multi-chip modules (MCMs), or other packaging hierarchies, testing for interconnection defects such as open and shorted joints or interconnects is performed. Well-known capacitance lead-frame sensing technologies exist that can detect opens between the pins of an integrated circuit (IC) and the mounting substrate (typically a printed circuit board). Typical implementation of capacitive probe assemblies that implement a capacitive sensor may be found in the following references, each of which is incorporated herein by reference for all that it teaches: U.S. Pat. No. 5,498,964, to Kerschner et al., entitled "Capacitive Electrode System for Detecting Open Solder Joints in Printed Circuit Assemblies", U.S. Pat. No. 5,124,660 to Cilingiroglu, entitled "Identification of Pin-Open Faults By Capacitive Coupling Through the Integrated Circuit Package", U.S. Pat. No. 5,254,953 to Crook et al., entitled "Identification of Pin-Open Faults By Capacitive Coupling Through the Integrated Circuit Package", and U.S. Pat. No. 5,557,209 to Crook et al., entitled "Identification of Pin-Open Faults By Capacitive Coupling Through the Integrated Circuit Package".

U.S. patent application Ser. No. UNKNOWN, entitled "Methods And Apparatus For Non-Contact Testing And Diagnosing Open Connections" to Parker et al., filed on Apr. 28, 2004, and assigned to the assignee of interest herein provides a method for testing for open power and ground connections in connectors and sockets, by making use of the inherently available coupling capacitors that exist between connector pins. When a signal pin is tested that is coupled to a nearby ground pin, an open on that ground pin will cause the signal pin measurement to rise in value.

For better understanding of the invention, a brief introduction to capacitive lead frame testing techniques is now presented. Turning to the drawings, FIG. 1A is a cross-cut side view of a basic test setup 10a for testing for open signal pins on an integrated circuit using conventional capacitive lead-frame testing techniques. As shown in FIG. 1, the test setup 10a includes a signal source 22, which supplies an alternating current (AC) signal, typically eight kiloHertz (8 KHz) at one hundred twenty millivolts (120 mV). The output of signal source 22 is connected to a tester probe 21a which connects to a node 41a of a printed circuit board 40. When a joint under test 35a is properly electrically connected to the node 41a of the printed circuit board 40, as shown in FIG. 1A, the output of the signal source 22 will also be electrically connected to the joint under test 35a. To reduce the effects of stray capacitive coupling between the joint under test 35a and respective neighboring joints, which interferes with the measurement of the joint under test, all neighboring joints 35b, 35c, 35d not being currently tested are preferably guarded by grounding them to the circuit ground 23.

The tester 20 includes a measuring device 24, such as an ammeter, a voltmeter, or other computing means which can be used to compute effective capacitance. The measuring device 24 is connected to a capacitive test probe 28 which comprises a receiver buffer 25 electrically coupled to a sense plate 26 of the capacitive test probe 28. The capacitive test probe 28 is placed on top of the integrated circuit package 31. A thin dielectric (not shown) may be placed between the integrated circuit package 31 and the sense plate 26 of the capacitive test probe 28. The capacitive test probe 28 is connected to a measuring device 24, such as an ammeter, a voltmeter or computing means to compute the effective capacitance.

When the test is performed, the signal source 22 is activated and applied to node 41a on the printed circuit board 40 which should be attached to the integrated circuit lead 34a by joint under test 35a. The source signal should then pass from the joint under test 35a to the lead 34a of the integrated circuit package 31. Through capacitive coupling between the lead 34a (which forms a plate) and sense plate 26 of the capacitive test probe 28, the signal is passed to the receiver buffer 25 of the capacitive test probe 28 and then to the measuring device 24. If the measured parameter falls within predetermined limits, then the joint under test 35a is connected to the node 41a of the printed circuit board 40. If the joint under test 35a is not connected to the node 41a of the printed circuit board 40 or if the conductive path between the output of the signal source 22 and node 41a is broken, a smaller signal will be conducted to the capacitive test probe 28 and the threshold level of the signal will not be measured by the measuring device 24, indicating that an open fault is present.

FIG. 1B is a schematic diagram illustrating the equivalent circuit 10b of the test setup 10a of FIG. 1A. As shown therein, the signal source 22 and measuring device 24 are commonly connected to a circuit ground 23. A sense capacitance ($C_{sensor}$) is formed between the sense plate 26 of the capacitive test probe 28 and the lead frame 34a to which the joint under test 35a is connected. If the joint under test 35a is not properly connected to the node 41a of the printed circuit board 40 (as represented in the model 10a with switch 12 open), a joint capacitance $C_{joint}$ is formed between the lead frame 34a and node 41a. If, however, the joint under test 35a is properly electrically connected to the node 41a (as represented in the model 10a with switch 12 closed), no joint capacitance $C_{joint}$ is formed.

It can be determined from the equivalent circuit model 10b that the measured capacitance for a properly soldered (i.e., "good") joint (where switch 12 is closed) is given by:

$$C_{GOOD\_JOINT} = C_{SENSE},$$

and the measured capacitance for an open (i.e., "bad") joint (where switch 12 is open) is given by:

$$C_{OPEN\_JOINT} = C_{SENSE} * C_{JOINT} / (C_{SENSE} + C_{JOINT}).$$

The difference between $C_{GOOD\_JOINT}$ and $C_{OPEN\_JOINT}$ is measurable and the values of the calculated parameters $C_{GOOD\_JOINT}$ and $C_{OPEN\_JOINT}$ can be used to classify joints as open or closed based on actual capacitively sensed measurements obtained from a device under test.

The above approaches focus on detection of open conditions between nodes of an integrated circuit device. However, defects that short nodes such as integrated circuit pins together are not typical applications of capacitive lead-frame testing. Most such defects are detected using standard shorts tests or Boundary-Scan approaches. However, it would be desirable to apply capacitive lead-frame technology to detection of shorts between nodes of an integrated circuit device when some of the nodes are inaccessible.

SUMMARY OF THE INVENTION

The present invention is a method for detecting shorts between accessible and inaccessible signal nodes (e.g., integrated circuit pins) of an electrical device (e.g., an integrated circuit), using capacitive lead frame technology. In accordance with the method of the invention, an accessible node under test is stimulated with a known source signal. A capacitive sense plate is capacitively coupled to at least one of the accessible node and inaccessible node of the electrical device, and a measuring device coupled to the capacitive sense plate capacitively senses a signal present on the at least one of the accessible node and inaccessible node of the electrical device. The capacitively sensed signal is representative of the effective capacitance between the accessible node and inaccessible node. Based on the value of the capacitively sensed signal, a known expected "defect-free" capacitively sensed signal measurement and/or a known expected "shorted" capacitively sensed signal measurement, one can determine whether a short fault exists between the accessible node and inaccessible node of the electrical device. Preferably, the known expected "defect-free" capacitively sensed signal measurement and/or known expected "shorted" capacitively sensed signal measurement are calculated from circuit models of the electrical device without defects and with a short between the accessible and inaccessible nodes, respectively.

BRIEF DESCRIPTION OF THE DRAWINGS

A more complete appreciation of this invention, and many of the attendant advantages thereof, will be readily apparent as the same becomes better understood by reference to the following detailed description when considered in conjunction with the accompanying drawings in which like reference symbols indicate the same or similar components, wherein.

DETAILED DESCRIPTION

The present invention will be described in detail with reference to illustrative embodiments wherein the device under test is an integrated circuit and the accessible nodes are input and/or output joints (taking the form of pads, pins, wire bonds, solder bumps, or other now-known or hereinafter developed electrical interconnects for joining input and/or output nodes of an integrated circuit to a printed circuit board). It will be appreciated that the present invention may be similarly applied to other types of electrical devices or circuit components (e.g., connectors and sockets) and nodes therein. The illustrative embodiments are presented by way of example only and not limitation, and it is intended that the invention be limited only by the claims.

As used herein, the term "node" refers to the conductive portion of an electrical device that forms a single electrical point in the equivalent schematic diagram of the electrical device. A node can be a pad of an integrated circuit die, a pin, a wire, a solder bump, or other interconnecting joint of an integrated circuit device, a pad or trace of a printed circuit board, an interconnecting joint of a component on the printed circuit board, or any combination thereof.

Figure 1A:
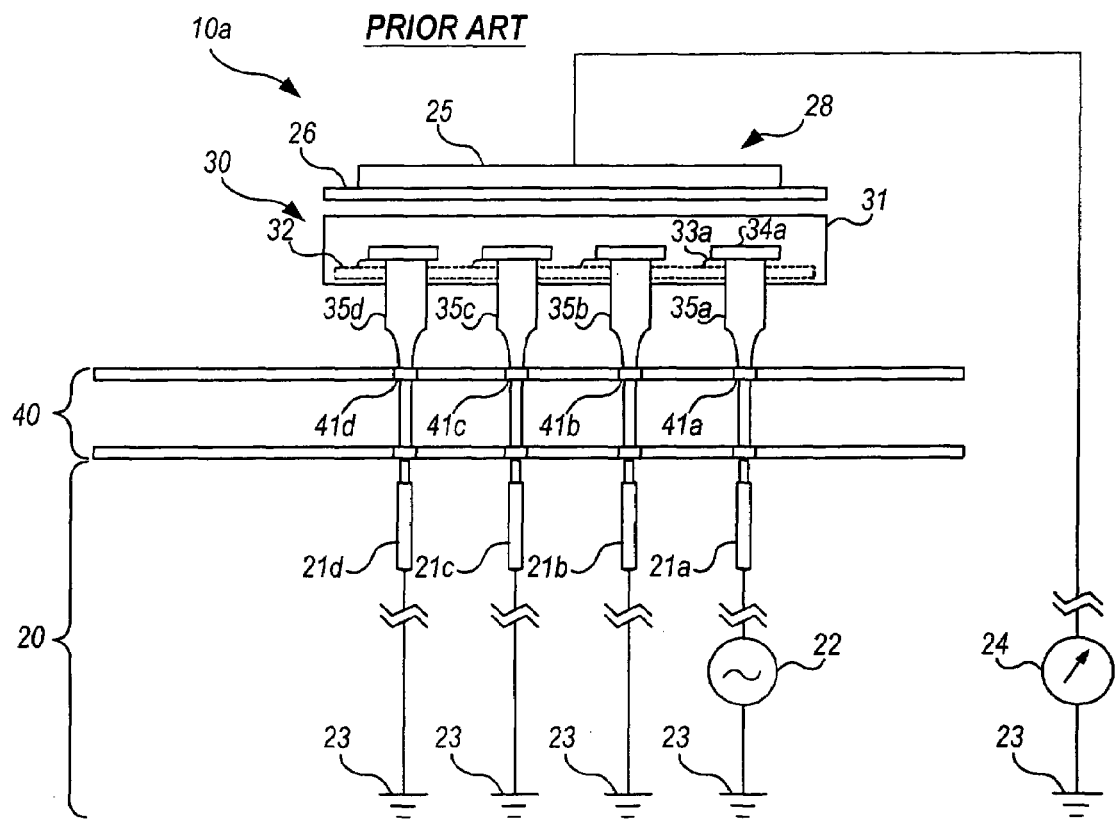
FIG. 1A is a cross-cut side view of a basic test setup for testing for open signal pins on an integrated circuit using conventional capacitive lead-frame testing techniques.
Figure 1B:
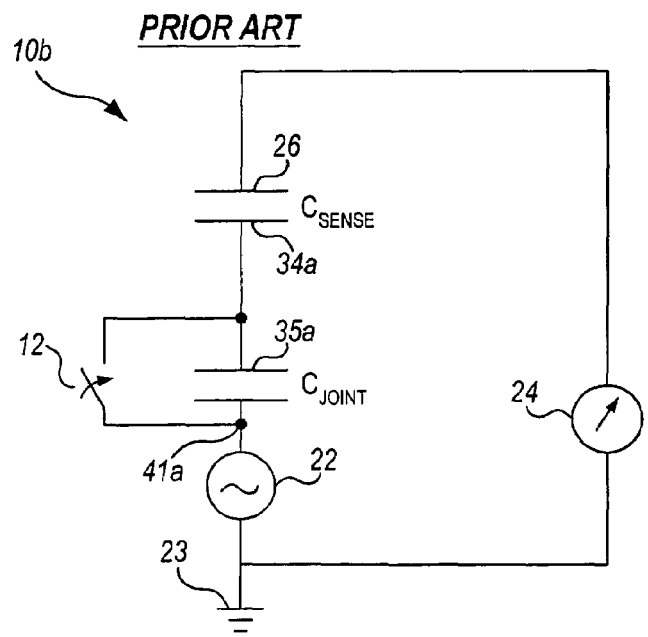
FIG. 1B is a schematic diagram illustrating the equivalent circuit of the test setup of FIG. 1A.
Figure 2:
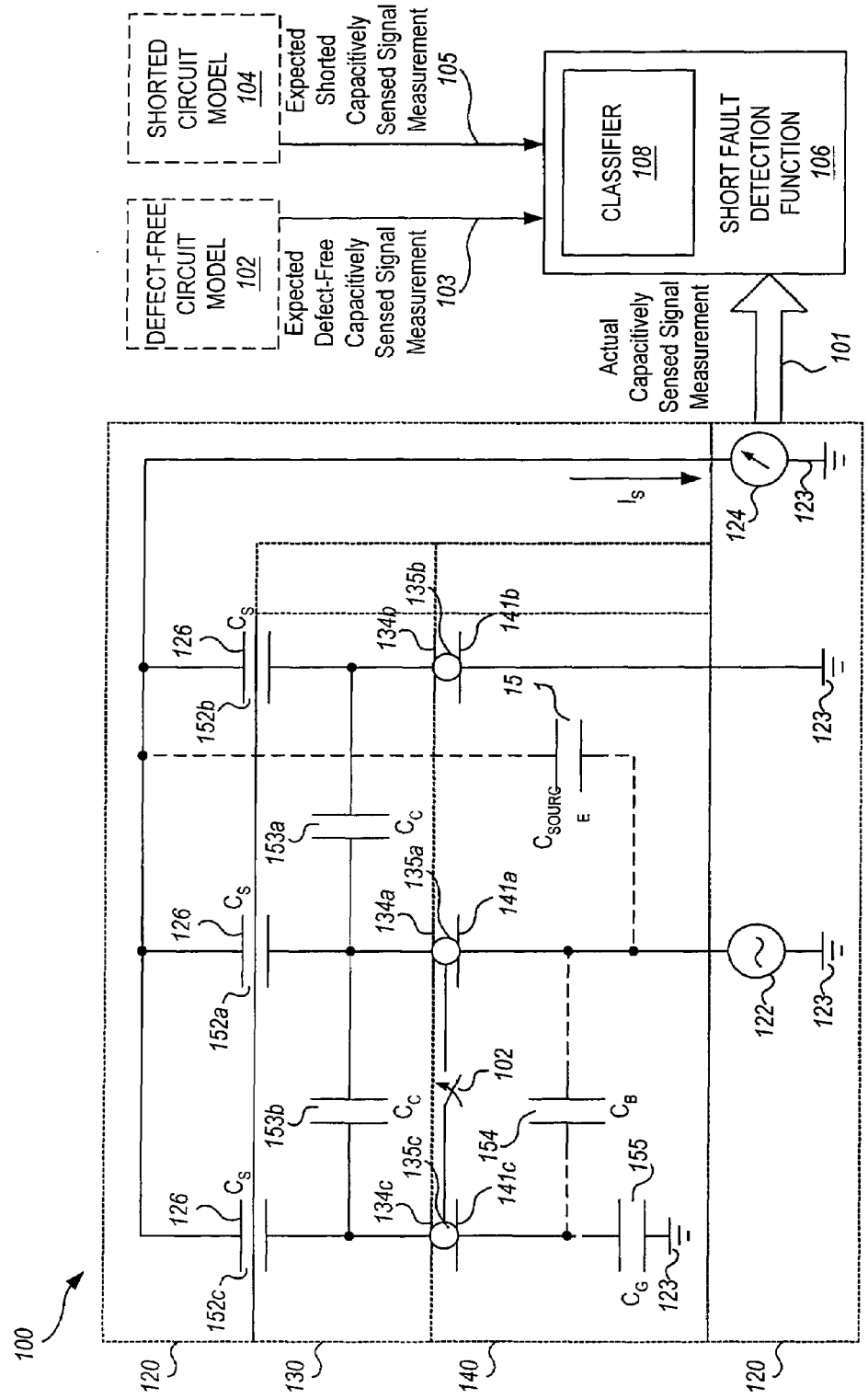
FIG. 2 is a schematic diagram of a test setup for testing for shorts between accessible and inaccessible nodes of an integrated circuit using capacitive lead-frame testing techniques in accordance with the invention.

Turning now to the invention, FIG. 2 illustrates a test setup 100 in accordance with the invention where a device to be tested 130 is connected to a board 140 with solder joints 135a, 135b, 135c. A capacitive sense plate 126 sits above the device under test 130 and couples to each joint 135a, 135b, 135c with a sense capacitance $C_s$ 152a, 152b, 152c. Joints 135a, 135b, 135c are coupled to nearby neighbors via respective coupling capacitances $C_c$ 153a, 153b. Some amount of parasitic capacitive coupling $C_{Source}$ 151 from the board 140 to the sense plate 126 exists that allows some of the source signal to appear on the sense plate 126. It is assumed that the current contributed by capacitance $C_{Source}$ 151 does not dominate the measurement, so it can be ignored. (The current contributed by capacitance $C_{Source}$ 151 would only dominate the measurement if only the least significant bits of the measurement were indicative of currents not due to capacitance $C_{Source}$ 151).

Joint 135a is the tested joint 135 and is known to be properly electrically connected to node 141a on the printed circuit board 140. Joint 135b is a nearby pin that is guarded for testing by connecting it to the circuit ground 123. Joint 135b is also known to be properly electrically connected to node 141a on the printed circuit board 140. Joint 135c is a neighbor of joint 135a, but is inaccessible to the tester 120 and cannot be grounded. The invention allows testing for a short to joint 135a by virtue of its parasitic relationship to joint 135a.

As illustrated in FIG. 2, joint 135a couples to joint 135c inside the device itself with a capacitance $C_c$ 153b. There is also some opportunity for capacitive coupling provided by the printed circuit board 140 itself, labeled $C_B$ 154. There is also likely to be a significant capacitance from the signal connected to joint 135c to ground, as indicated by label $C_G$ 155. Joint 135c and its associated wiring are responsible for the magnitudes of these capacitive couplings. There may be other devices also attached to this wiring. The present discussion considers the most likely case that this wiring only connects to joints to other integrated circuits. Since the capacitive lead-frame test technique uses very small stimulus voltages, these device joints cannot be forward-biased and therefore cannot consume any current themselves. If other devices such as passive components (e.g., termination resistors) are connected to this joint, then such other devices must be considered in a model of the circuit. However, for simplicity of analysis, devices such as passive components are not considered in the illustrative embodiment.

Figure 3:
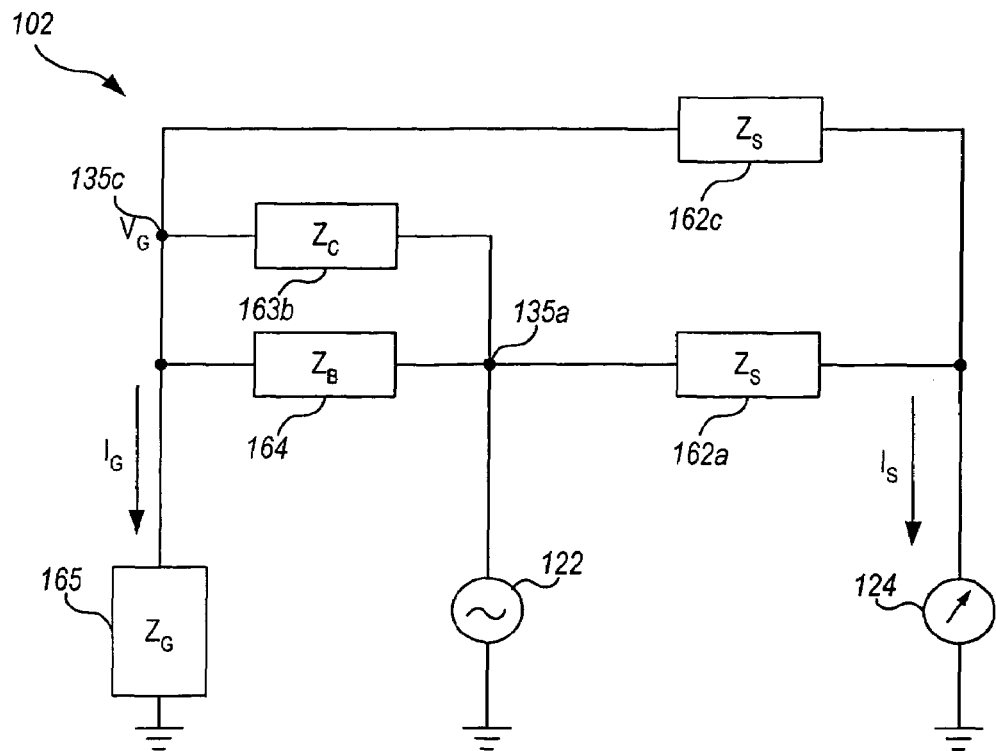
FIG. 3 is a circuit model of the measurement circuit of FIG. 2 when an inaccessible joint is not shorted to the stimulated accessible joint.
Figure 4:
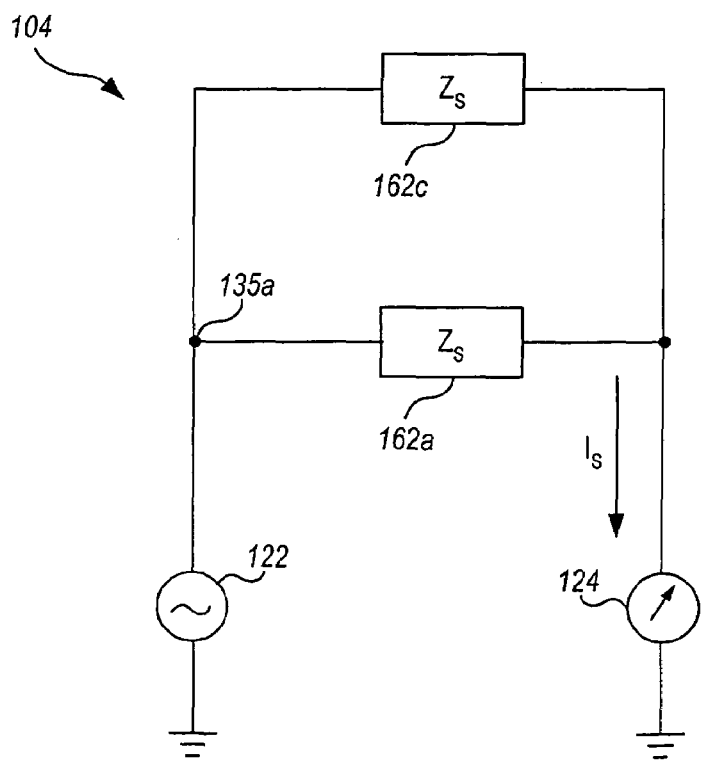
FIG. 4 is a circuit model of the measurement circuit of FIG. 2 when an inaccessible joint is shorted to the stimulated accessible joint.

Consider two cases:

(1) Joint 135c is not shorted to joint 135a as modeled at 102 in FIG. 3 (the defect-free case), and (2) Joint 135c is shorted to joint 135a, as modeled at 104 in FIG. 4.

In the defect-free model 102 as illustrated in FIG. 3, the various capacitive couplings are modeled by a network of impedances 162a, 162c, 163b, 164, 165 (the AC voltage source frequency and capacitance magnitudes will determine the actual values of these impedances) that supply current to the measurement device 124. (Note these impedances 162a, 162c, 163b, 164, 165 are due to the various coupling capacitances 152a, 152c, 153b, 154, 155 with the same subscripts). In this system, there are two general current paths. The first current path flows between the stimulated joint 135a to the measuring device 124 directly through an impedance $Z_s$ 162a due to sense capacitance $C_s$ 152a. The second current path flows between the joint 135c and the measuring device 124 through a divider made up of impedances $Z_C$ 163b, $Z_B$ 164, and $Z_G$ 165 to a second impedance $Z_s$ 162c representing the impedance of sense capacitance $C_S$ 152c. If joint 135c had been accessible and grounded, none of this second path current could have made it to the measurement device 124 but would have been diverted to ground 123. Because joint 135c is not accessible and grounded, capacitive coupling between joint 135a and 135c contributes to the current flow, which raises the current $I_s$ seen when testing joint 135b while joint 135c is connected. The voltage $V_G$ seen at the divider is related to the source voltage V by the equation:

$$V_G = V*(Z_G*Z_S/(Z_G+Z_S))/((Z_B*Z_C/(Z_B+Z_C)+((Z_G*Z_S/(Z_G+Z_S)))).$$

The current measured (lhd s) can be calculated according to the equation:

$$I_s = (V+V_G)/Z_s.$$

The current measurement can be converted back to a capacitance, referred to herein as the effective capacitance $C_{Eff}$ of the circuit, by dividing the current $I_s$ by V.

FIG. 4 illustrates the model 104 of the measurement circuit when joint 135c is shorted to joint 135a. As illustrated in FIG. 4, there are two equivalent current flow paths between the stimulated joint 135a and the measurement device 124. This current $I_s$ is given by:

$$I_s = 2*V/Z_s.$$

As before the effective capacitance $C_{Eff}$ measured when joint 135c is shorted as $I_s$ divided by the source voltage V can be computed. A comparison of $C_{Eff}$ for defect-free model of FIG. 3 and shorted model of FIG. 4 is shown in the graph in FIG. 5.

Figure 5:
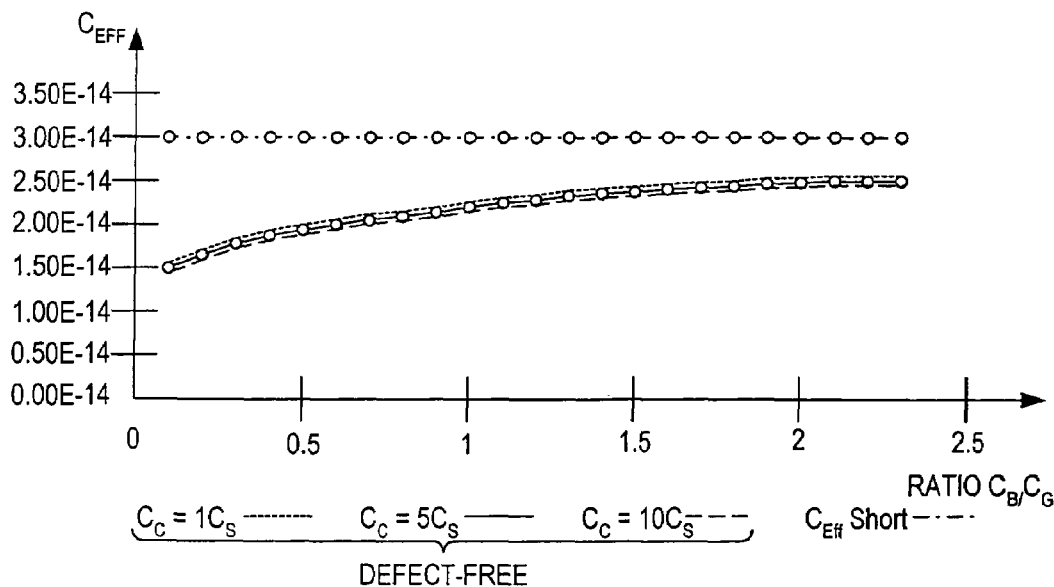
FIG. 5 is a graph illustrating the difference between the effective capacitance in the defect-free and shorted models of FIGS. 3 and 4.

FIG. 5 shows $C_{Eff}$ versus the ratio of $C_B/C_G$. Both $C_B$ and $C_G$ are assumed to be much larger than $C_S$ or $C_C$. The value of $C_S$ in the illustrative embodiment of FIG. 5 is 15 fF.

As illustrated by the top straight line in FIG. 5, the shorted model of FIG. 4 creates two times the $C_S$ capacitance measurement and is flat. The defect-free model (lower curved lines) of FIG. 3 (for $C_C$ set to 1, 5 and 10 times $C_S$) are almost coincident, sloping up from about one times $C_S$ and approaching the shorted case asymptotically. As $C_B$ increases relative to $C_G$, the measured capacitance gets closer to the shorted case. In practice, we expect $C_B$ to be less than $C_G$ in many cases, so the left-hand portion of the graph will be more relevant.

Finally, consider what happens if there is another joint 135d that is guarded and adjacent to inaccessible joint 135c. Joint 135d will couple to joint 135c with a capacitance $C_C$ and another $C_B$, which are shunted directly to ground by the guarding. This will create even more shunt attenuation in the defect-free case, causing the curves in the graph to approach their asymptote much more slowly. This means that guarded pins around the inaccessible pin will make shorts easier to detect.

Figure 6A:
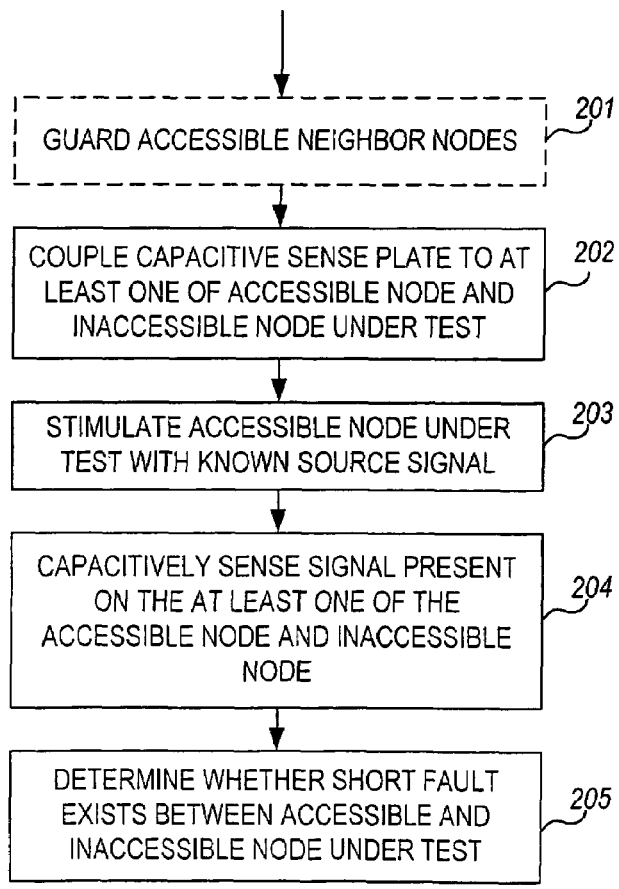
FIG. 6A is a flowchart illustrating a preferred method of the invention for detecting shorts between accessible and inaccessible nodes of an electrical device.

The analysis of FIGS. 3–5 can be practically applied to detect short faults between nodes in electrical devices. FIG. 6A is a flowchart illustrating a preferred method of the invention for detecting shorts between accessible and inaccessible nodes of an electrical device. In this method, accessible neighbor nodes are first preferably guarded (e.g., grounded) (step 201). A capacitive sense plate is capacitively coupled to at least one of the accessible node and inaccessible node of the electrical device (step 202). The accessible node is then stimulated with a known source signal (step 203). A measuring device coupled to the capacitive sense plate capacitively senses a signal present on the at least one of the accessible node and inaccessible node of the electrical device (204). The capacitively sensed signal is representative of the effective capacitance between the accessible node and inaccessible node. Based on the value of the capacitively sensed signal, a short fault detection function 108 (FIG. 2) can determine whether a short fault exists between the accessible node and inaccessible node of the electrical device (step 205).

Figure 6B:
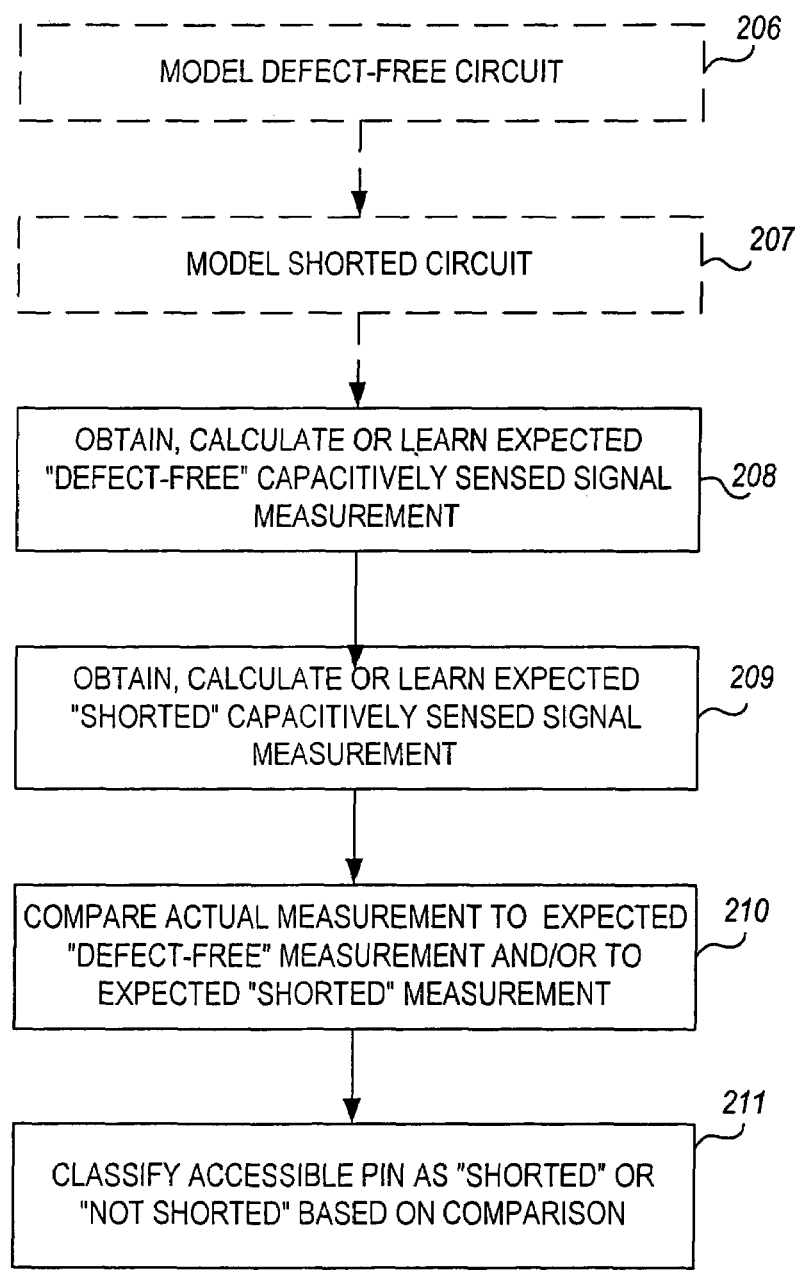
FIG. 6B is an exemplary embodiment for determining whether a short fault exists between the accessible node and inaccessible node of the electrical device based on the value of the capacitively sensed signal.

In particular, FIG. 6B illustrates an exemplary embodiment for determining whether a short fault exists between the accessible node and inaccessible node of the electrical device based on the value of the capacitively sensed signal. In the preferred embodiment, an electrical circuit comprising the accessible node and the inaccessible node of the electrical device, the stimulus source, and the measuring device is modeled in the defect-free case, including the possible capacitive couplings between the various nodes of the modeled circuit (step 206). An illustration of this step as applied to the joints 135a and 135b of the electrical device 100 of FIG. 2 is shown in FIG. 3 and the discussion pertaining thereto. The electrical circuit comprising the accessible node and the inaccessible node of the electrical device, the stimulus source, and the measuring device is also modeled in the shorted case, including the possible capacitive couplings between the various nodes of the modeled circuit, assuming that the accessible node and inaccessible node are shorted together (step 207). An illustration of this step as applied to the joints 135a and 135b of the electrical device 100 of FIG. 2 is shown in FIG. 4 and the discussion pertaining thereto. The expected defect-free capacitively sensed signal measurement (effective capacitance, current or voltage) 103 (FIG. 2) that is measured by the measuring device 124 may be calculated using circuit theory for the defect-free case from the defect-free circuit model (modeled in step 206) (step 208) and the expected shorted capacitively sensed signal measurement (effective capacitance, current or voltage) 105 (FIG. 2) that is measured by the measuring device 124 may be calculated using circuit theory for the shorted case from the shorted circuit model (modeled in step 202) (step 209) to compare against the actual capacitively sensed signal measurement (210). Alternatively, the expected "defect-free" capacitively sensed signal measurement 103 may be learned by making measurements on one or more known good boards (i.e., devices under test that are known to be defect free), and using these one or more measurements (or a calculated average of or other statistic derived from the measurements) as the expected "defect-free" capacitively sensed signal measurement 103. Similarly, the expected "shorted" capacitively sensed signal measurement 105 may be learned by making measurements on one or more devices under test that are known to have the short defect, and using these one or more measurements (or a calculated average of or other statistic derived from the measurements) as the expected "shorted" capacitively sensed signal measurement 105. The accessible and inaccessible nodes can then be classified by a classifier 106 as "not shorted" if the actual capacitively sensed signal measurement is substantially close to (i.e., within a guardband of) the expected "defect-free" capacitively sensed signal measurement or as "shorted" if the actual capacitively sensed signal measurement is substantially close to (i.e., within a guardband of) the expected "shorted" capacitively sensed signal measurement (211). Finally, in the alternative, the expected defect-free capacitively sensed signal measurement 103 and/or the expected shorted capacitively sensed signal measurement 105 may be obtained from some other source (e.g., simulated design calculations, expert knowledge, etc). Based on the observation from the previous discussion that the measured current Is or effective capacitance $C_{Eff}$ will be greater if a short exists than if no short exists, in a very simple test, the short fault detection function 108 can merely compare the actual capacitively sensed signal measurement 101 from the device under test to the expected defect-free capacitively sensed signal measurement 103. If the actual capacitively sensed signal measurement 101 is greater than (taking into account measurement error) the expected defect-free capacitively sensed signal measurement 103, then the short fault detection function 108 may conclude that a short exists between the accessible node and inaccessible node being tested.

Although this preferred embodiment of the present invention has been disclosed for illustrative purposes, those skilled in the art will appreciate that various modifications, additions and substitutions are possible, without departing from the scope and spirit of the invention as disclosed in the accompanying claims. It is also possible that other benefits or uses of the currently disclosed invention will become apparent over time.

What is claimed is:

1. A method for detecting a short fault between an accessible node of an electrical device and an inaccessible node of said electrical device, said method comprising the steps of:
   stimulating said accessible node of said electrical device with a known source signal;
   capacitively sensing a signal representative of an effective capacitance between said accessible node and said inaccessible node; and
   determining whether a short fault exists between said accessible node and said inaccessible node of said electrical device based on said capacitively sensed signal.

2. A method in accordance with claim 1, comprising the step of:
   guarding accessible neighbor nodes to said accessible node and said inaccessible node.

3. A method in accordance with claim 1, wherein:
   said electrical device comprises an integrated circuit; and
   said accessible node comprises an input and/or output joint of said integrated circuit.

4. A method in accordance with claim 1, wherein said step for determining whether a short fault exists between said accessible node and said inaccessible node of said electrical device based on said capacitively sensed signal comprises the steps of:
   obtaining at least one of an expected defect-free capacitively sensed signal measurement and an expected shorted capacitively sensed signal measurement;
   comparing said capacitively sensed signal against said at least one of said expected defect-free capacitively sensed signal measurement and said expected shorted capacitively sensed signal measurement; and
   classifying said accessible node either as shorted to said inaccessible node or as not shorted to said inaccessible node based on results of said comparing step.

5. A method in accordance with claim 4, wherein said step for obtaining at least one of said expected defect-free capacitively sensed signal measurement and said expected shorted capacitively sensed signal measurement comprises the steps of:
   if said expected defect-free capacitively sensed signal measurement is obtained:
      modeling a defect-free electrical circuit comprising said accessible node, said inaccessible node, said stimulus source, and said measuring device, wherein said accessible node and said inaccessible node are not shorted together;
      calculating said expected defect-free capacitively sensed signal measurement for said defect-free circuit model that would be measured by said measuring device in said defect-free circuit model; and
   if said expected shorted capacitively sensed signal measurement is obtained:
      modeling a shorted electrical circuit comprising said accessible node, said inaccessible node, said stimulus source, and said measuring device, wherein said accessible node and said inaccessible node are shorted together;
   calculating an expected shorted capacitively sensed signal measurement for said shorted circuit model that would be measured by said measuring device in said shorted circuit model.

6. A method in accordance with claim 4, wherein said step for obtaining at least one of said expected defect-free capacitively sensed signal measurement and said expected shorted capacitively sensed signal measurement comprises the steps of:
   if said expected defect-free capacitively sensed signal measurement is obtained:
      obtaining one or more defect-free capacitively sensed signal measurements on a known good electrical device identical by design to said electrical device, wherein said respective accessible node and inaccessible node of said known good electrical device are known to be not shorted together; and
      basing said expected defect-free capacitively sensed signal measurement on a statistical combination of said one or more defect-free capacitively sensed signal measurements; and
   if said expected shorted capacitively sensed signal measurement is obtained:
      obtaining one or more shorted capacitively sensed signal measurements on a known bad electrical device identical by design to said electrical device, wherein said respective accessible node and inaccessible node of said known bad electrical device are known to be shorted together; and basing said expected shorted capacitively sensed signal measurement on a statistical combination of said one or more shorted capacitively sensed signal measurements.

7. A method in accordance with claim 4, wherein said classifying step comprises:
   classifying said accessible node as not shorted to said inaccessible node if said capacitively sensed signal is substantially close to said expected defect-free capacitively sensed signal measurement; and
   classifying said accessible node as shorted to said inaccessible node if said capacitively sensed signal is substantially close to said expected shorted capacitively sensed signal measurement.

8. A method in accordance with claim 4, wherein said step for capacitively sensing said signal representative of said effective capacitance between said accessible node and said inaccessible node comprises the steps of:
   capacitively coupling a capacitive sense plate to at least one of the accessible node and inaccessible node;
   coupling a measuring device to said capacitive sense plate; and
   sensing, with said measuring device, a signal present on the at least one of the accessible node and inaccessible node of the electrical device.

9. A method in accordance with claim 4, wherein:
   said electrical device comprises an integrated circuit; and
   said accessible node comprises an input and/or output joint of said integrated circuit.

10. A method in accordance with claim 1, wherein said step for capacitively sensing said signal representative of said effective capacitance between said accessible node and said inaccessible node comprises the steps of:
   capacitively coupling a capacitive sense plate to at least one of the accessible node and inaccessible node;
   coupling a measuring device to said capacitive sense plate; and
   sensing, with said measuring device, a signal present on the at least one of the accessible node and inaccessible node of the electrical device.

11. A method in accordance with claim 10, wherein:
   said electrical device comprises an integrated circuit; and
   said accessible node comprises an input and/or output joint of said integrated circuit.

* * * * *